US012701892B2

(12) United States Patent
Choi et al.

(10) Patent No.: US 12,701,892 B2
(45) Date of Patent: Aug. 4, 2026

(54) POWER LINE DESIGN FOR SENSORS IN DISPLAY PANEL

(71) Applicant: GOOGLE LLC, Mountain View, CA (US)

(72) Inventors: Sangmoo Choi, Palo Alto, CA (US); Adrian Gheorghe Manea, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 485 days.

(21) Appl. No.: 17/760,679

(22) PCT Filed: Dec. 8, 2020

(86) PCT No.: PCT/US2020/063789
§ 371 (c)(1),
(2) Date: Mar. 15, 2022

(87) PCT Pub. No.: WO2021/126597
PCT Pub. Date: Jun. 24, 2021

(65) Prior Publication Data
US 2022/0392973 A1 Dec. 8, 2022

Related U.S. Application Data

(60) Provisional application No. 62/950,854, filed on Dec. 19, 2019.

(51) Int. Cl.
*H01L 27/32* (2006.01)
*H10K 59/131* (2023.01)
*H10K 59/60* (2023.01)
(52) U.S. Cl.
CPC ........... *H10K 59/60* (2023.02); *H10K 59/131* (2023.02)

(58) Field of Classification Search
CPC ................. H10K 59/60; H10K 59/131; H10K 59/10–221; H10K 59/00–95;
(Continued)

(56) References Cited

U.S. PATENT DOCUMENTS 6,025,901 A 2/2000 Adachi et al.
2017/0288008 A1 10/2017 Kim et al.
(Continued)

FOREIGN PATENT DOCUMENTS

CN 104732891 6/2015
CN 107749287 3/2018
(Continued)

OTHER PUBLICATIONS

Ma English translation (Year: 2019).*
(Continued)

*Primary Examiner* — Steven B Gauthier
*Assistant Examiner* — Rhys Poniente Sheker
(74) *Attorney, Agent, or Firm* — Fish & Richardson P.C.

(57) ABSTRACT

A display panel includes: a display active area having multiple pixels; a bezel surrounding the display active area; a connector tab attached to the bezel at a first edge of the bezel; and a power line(s) formed from an opaque material, the power line(s) extending from the connector tab to a second edge of the bezel opposite the first edge, the power line(s) being configured to supply electrical power to the display active area, the power line(s) having a first width in a plane of the display along a side edge of the bezel between the first and second edges and, at a portion of the bezel at the second edge, a second width narrower than the first width or a gap in the power lines, the portion of the bezel at the second edge being substantially transparent.

11 Claims, 2 Drawing Sheets

(58) Field of Classification Search

CPC ...... H10K 50/00–88; H10K 71/00–861; G09F 9/33; H01L 2924/171–17798; H01L 2924/14649–14652

See application file for complete search history.

(56)                    References Cited

U.S. PATENT DOCUMENTS

| | | |
|---|---|---|
| 2018/0181163 A1 | 6/2018 | Shin et al. |
| 2018/0212015 A1* | 7/2018 | Chen .................... H10K 59/131 |
| 2019/0206958 A1 | 7/2019 | Lee et al. |
| 2019/0304366 A1 | 10/2019 | Ka et al. |
| 2020/0185643 A1* | 6/2020 | Moon ................ H10K 59/8791 |
| 2020/0202784 A1* | 6/2020 | Kim ..................... G09G 3/3291 |
| 2020/0358025 A1* | 11/2020 | Tan ........................ H10K 59/88 |
| 2020/0365676 A1* | 11/2020 | Lim ..................... H10K 59/131 |

FOREIGN PATENT DOCUMENTS

| | | | | |
|---|---|---|---|---|
| CN | 108732841 | 11/2018 | | |
| CN | 108762549 | 11/2018 | | |
| CN | 109256399 | 1/2019 | | |
| CN | 109256399 A * | 1/2019 | ......... | H01L 27/1214 |
| CN | 109585519 | 4/2019 | | |
| CN | 110010622 | 7/2019 | | |
| CN | 110310961 | 10/2019 | | |
| CN | 110491918 | 11/2019 | | |
| CN | 110572504 | 12/2019 | | |
| EP | 3499490 | 6/2019 | | |
| JP | H05226076 | 9/1993 | | |
| JP | H09-068714 | 3/1997 | | |
| JP | 2007-164162 | 6/2007 | | |
| JP | 2017-167203 | 9/2017 | | |
| JP | 2017-167478 | 9/2017 | | |
| KR | 10-2019-0083023 | 7/2019 | | |
| WO | WO 2017038670 | 3/2017 | | |
| WO | WO 2019178782 | 9/2019 | | |

OTHER PUBLICATIONS

Notice of Allowance in Japanese Appln. No. 2022-522720, mailed on Sep. 3, 2024, 6 pages (with English translation).

Office Action in European Appln. No. 20828734.2, mailed on Jul. 3, 2024, 6 pages.

Office Action in Korean Appln. No. 10-2022-7012503, mailed on Oct. 17, 2024, 16 pages (with English translation).

Office Action in Japanese Appln. No. 2022-522720, mailed on May 21, 2024, 9 pages (with English translation).

International Preliminary Report on Patentability in International Appln. No. PCT/US2020/063789, mailed on Jun. 30, 2022, 15 pages.

International Search Report and Written Opinion in International Appln. No. PCT/US2020/063789, mailed on Jun. 17, 2021, 23 pages.

Invitation to Pay Additional Fees and where Applicable Protest Fees in International Appln. No. PCT/US2020/063789, mailed on Mar. 22, 2021, 16 pages.

Notice of Allowance in Korean Appln. No. 10-2022-7012503, mailed on May 19, 2025, 4 pages (with English translation).

Office Action in Chinese Appln. No. 202080070744.4, mailed on Jan. 12, 2026, 15 pages (with English translation).

* cited by examiner

POWER LINE DESIGN FOR SENSORS IN DISPLAY PANEL

CROSS-REFERENCE TO RELATED APPLICATION

This application is a National Phase entry under 35 U.S.C. 371 of PCT Application Serial No. PCT/US2020/063789, filed Dec. 8, 2020, which claims priority to U.S. Provisional Application Ser. No. 62/950,854, filed Dec. 19, 2019, the entirety of which is herein incorporated by reference.

TECHNICAL FIELD

This specification relates generally to electronic displays.

BACKGROUND

Flat display panels, such as active matrix organic light emitting diode (AMOLED) display panels, generally include a display active area surrounded by a bezel. In many conventional active matrix organic light emitting diode (AMOLED) display panels, there are power lines—typically formed from a metal—on the top bezel region of the display panel. Particularly, in AMOLED panels, there are negative potential power lines, which are for the cathode power source supply of the OLED device.

In many devices that use display panels, such as mobile phones and tablet computers, front-facing sensors are located in the display's bezel. However, metal layers that form the power lines can attenuate radiation detected by the sensors. For this reason, front facing sensors are often offset laterally from the power lines in the bezel. This can result in a relatively wide bezel at the edge of the display that includes the sensor because the bezel width needs to accommodate both the power lines and the sensor.

SUMMARY

Offsetting front facing sensors from electrode lines can increase the width of the bezel. However, locally removing the power line (or significantly reducing its width) at the location of the front-facing sensor(s) can allow the sensors to be positioned closer to the active area of the display, thereby reducing the bezel width at the top of the display.

In general, in a first aspect, the invention features a display panel, including: a display active area having multiple pixels extending in a plane of the display panel; a bezel surrounding the display active area; a connector tab attached to the bezel at a first edge of the bezel; and one or more power lines formed from a material opaque at one or more wavelengths of electromagnetic radiation, the power lines extending from the connector tab to a second edge of the bezel opposite the first edge of the bezel, the power lines being configured to supply electrical power to the display active area during operation of the display panel, the power lines having a first width in the plane of the display along a side edge of the bezel between the first and second edges and, at a portion of the bezel at the second edge, a second width narrower than the first width or a gap in the power lines, the portion of the bezel at the second edge being substantially transparent to the one or more wavelengths of electromagnetic radiation.

Embodiments of the display panel can include one or more of the following features. For example, the material can be a metal.

The first width can be in a range from 0.1 mm to 3 mm.

The second width can be in a range from 0.0001 mm to 0.1 mm.

The bezel can have a width of 1 mm or less at the second edge.

The first portion can have a width that is 50% or more of a width of the bezel at the second edge.

The display panel can include a transparent electrode layer extending over the display active area and at least a portion of the bezel. The transparent electrode can electrically connect the power line across the portion of the bezel at the second edge.

The display panel can be an organic light emitting diode (OLED) display panel.

In another aspect, the invention features a device including the display panel and a sensor module positioned adjacent the portion of the bezel at the second edge and arranged to direct and/or receive electromagnetic radiation at the one or more wavelengths transmitted through the bezel at the portion of the bezel.

The device can be a smart phone or a tablet computer.

The sensor module can include a sensor for detecting electromagnetic radiation at the one or more wavelengths.

The sensor module can include an emitter of electromagnetic radiation at the one or more wavelengths.

In a further general aspect, there is provided a display panel including: a display active area having multiple pixels; a bezel surrounding the display active area; a connector tab attached to the bezel at a first edge of the bezel; and a power line(s) formed from an opaque material, the power line(s) extending from the connector tab to a second edge of the bezel opposite the first edge, the power line(s) being configured to supply electrical power to the display active area, the power line(s) having a first width in a plane of the display along a side edge of the bezel between the first and second edges and, at a portion of the bezel at the second edge, a second width narrower than the first width or a gap in the power lines, the portion of the bezel at the second edge being substantially transparent.

Among other advantages, embodiments feature display panels (e.g., AMOLED display panels) that have a narrow bezel at an edge of the display panel (e.g., a top edge) that accommodates a front facing sensor (e.g., a facial detection sensor). For example, by reducing the width, or even removing entirely, power lines that are opaque at the operational wavelength(s) of the sensor at a portion of the bezel accommodating the sensor, the bezel width can be reduced relative to a display panel that features power lines that extend with a constant width along the entire edge of the display panel.

Additional advantages will be apparent from the description below, the drawings, and the claims.

BRIEF DESCRIPTION OF THE DRAWINGS

Like reference numbers and designations in the various drawings indicate like elements.

DETAILED DESCRIPTION

Figures 1A, 1B, 1C:
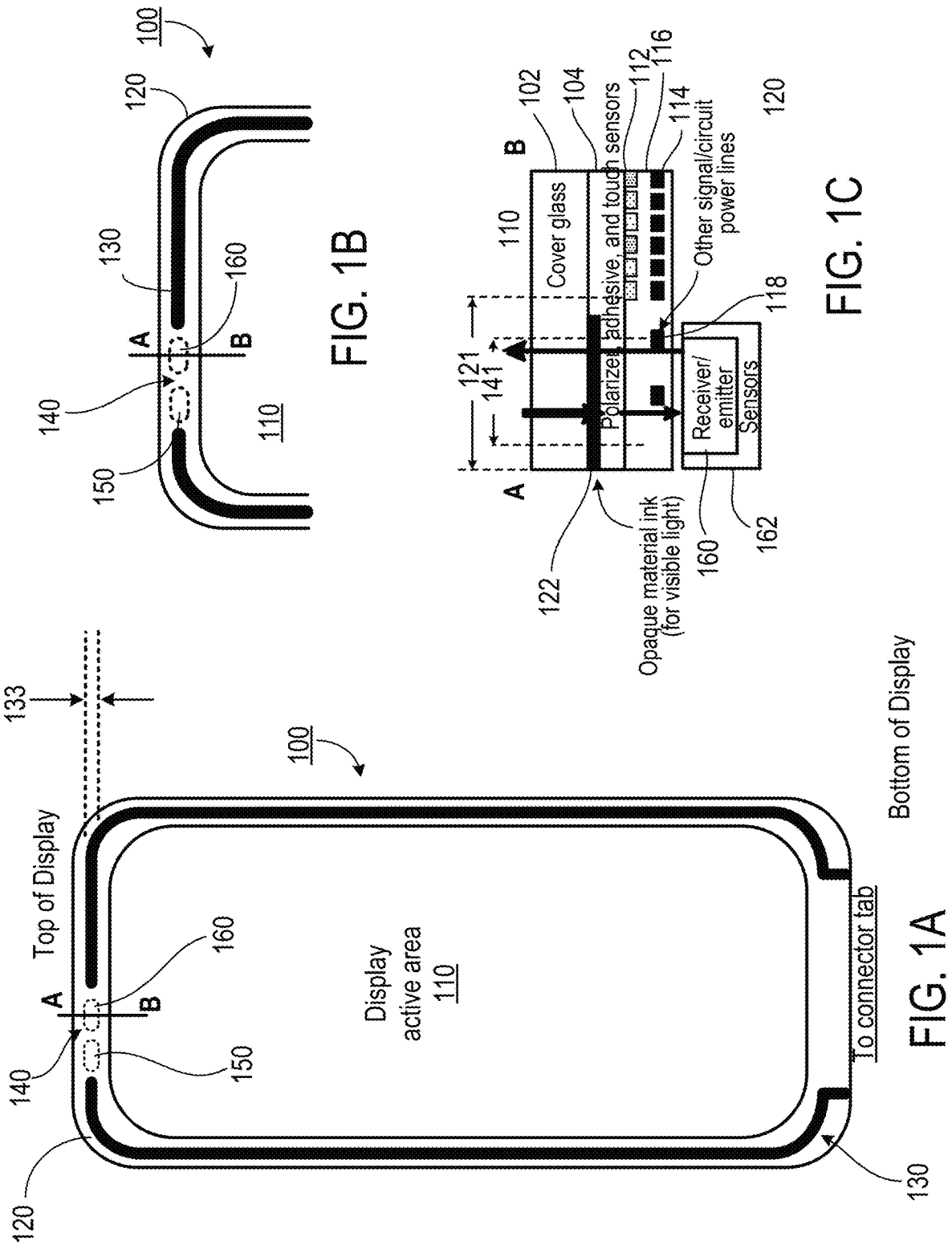
FIG. 1A is a plan view of an example of an AMOLED display panel.
FIG. 1B is a plan view of the top portion of the AMOLED display panel shown in FIG. 1A.
FIG. 1C is a cross-sectional view of the top portion of the AMOLED display panel shown in FIG. 1B.

Referring to FIG. 1A, an AMOLED display panel 100 includes a display active area 110 and a bezel 120 that surrounds display active area 110. Power lines 130 are positioned in bezel 120 running from a connector tab at the bottom of display panel 100, up along both sides of the bezel, to the top of the bezel. Power lines 130 terminate at the top of the panel, providing a gap 140 corresponding to the location of a sensor module that includes an emitter 150 and a sensor 160. Power lines 130 deliver electrical current for emission to OLED pixels in display active area 110 during operation of the panel. The connector tab, not shown in FIG. 1A, includes components like integrated circuits and connectors and is typically folded behind active area 110 and bezel 120 when display panel 100 is installed in a device.

Generally, power lines 130 are formed from a material that is a good electrical conductor, such as certain metals like copper or aluminum. The power lines should have a resistivity sufficiently low to deliver electrical current to the display active area for light emission. Power lines 130 have a width 133 at the top edge of the display panel. The width of the power lines is generally selected so that the resistivity of the power lines is sufficiently low. The width can be constant along the top edge of bezel 120. In some embodiments, the width of power lines 130 is constant along the side edges of the bezel as well as at the top edge. In certain embodiments, width 133 can be in a range from 0.1 mm to 3 mm (e.g., 0.2 mm or more, 0.5 mm or more, 2 mm or less, 1 mm or less).

Referring also to FIG. 1B, which shows the top portion of display panel 100 in plan view, and FIG. 1C, which shows a cross-sectional view through display panel 100 through along the line designated AB in FIGS. 1A and 1B, when installed in a device (e.g., a mobile phone or tablet computer) a sensor module 162 is mounted beneath display panel 100. Sensor module 162 includes front facing sensor 150 and front facing emitter 160 positioned to respectively receive radiation transmitted from the ambient environment through gap 140 and emitting radiation that is transmitted from sensor module 162 through gap 140 to the ambient environment.

Generally, the operational wavelength(s) of sensor 150 and emitter 160 are the same. The operational wavelengths can vary depending on the specific function of sensor module 162. In some embodiments, the operational wavelength(s) include infrared wavelengths. The operational wavelength(s) can be outside the visible portion of the electromagnetic spectrum. The material that power lines 130 is formed from can be opaque to the operational wavelength (s) of sensor module 162. For example, electrically-conducting metals such as copper and aluminum is opaque to certain visible and infrared wavelengths.

Referring specifically to FIG. 1C, display panel 100 is a multilayer device that includes an OLED layer 116, one or more additional layers 104 on top of OLED layer 116, and a cover glass 102 on top of addition layers 104. OLED layer 116 includes emissive pixels 112 and pixel circuits 114 in display active area 110. The pixels may extend in a plane of the display panel 100. Other signal/circuit power lines 118 are located in the OLED layer 116 in the bezel.

A layer 122 of material opaque to visible light is included in bezel 120 between additional layers 104 and cover glass 102.

Bezel 120 extends a width 121, which is typically in a range from about 0.1 mm to about 3 mm. In some embodiments, width 121 is the same or slightly larger than width 133 of power lines 130. For example, width 121 can be no more than 0.5 mm greater than width 133 (e.g., 0.3 mm or less, 0.2 mm or less, 0.1 mm or less, 0.05 mm or less).

Gap 140 extends a width 141, corresponding to the width 133 of power lines 130. As noted above, width 141 is less than width 121 of bezel 120. In some embodiments, width 141 can be in a range from about 0.05 mm to about 2 mm.

The materials composing the bezel at gap 140 are generally transparent to the operational wavelength(s) of sensor module 162 so that sufficient radiation at this wavelength(s) can be transmitted through the bezel to allow for effective operation of the sensor module. In some embodiments, the bezel at gap 140 can transmit about 30% or more of the radiation normally incident thereon at the operational wavelength(s). In contrast, the bezel at power lines 130 can transmit 1% or less of normally incident radiation at the operational wavelength(s).

Many OLED display panels include a cathode electrode that extends over the entire display active region and into the bezel. Such cathode electrodes can be formed from a material transparent to visible light to allow for transmission of light from the pixels in the display active region. For example, cathode electrodes can be formed from indium tin oxide or a thin silver layer. In some embodiments, the cathode electrode can be used to electrically connect the two terminals of power lines 130 across gap 140.

Figure 2A:
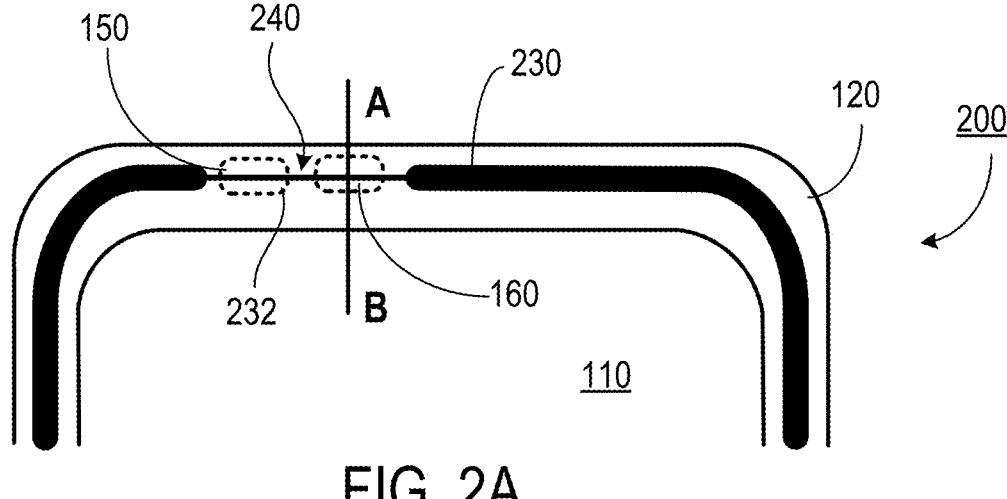
FIG. 2A is a plan view of a top portion of another example of an AMOLED display panel.
Figure 2B:
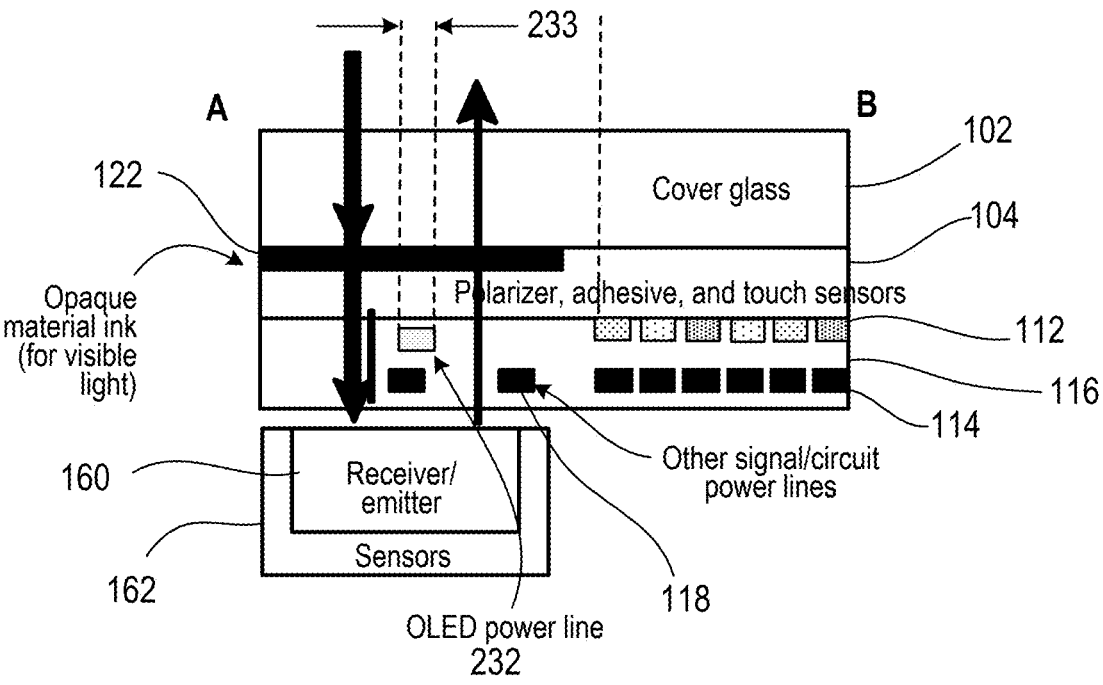
FIG. 2B is a cross-sectional view of the top portion of the AMOLED display panel shown in FIG. 2A.

While power lines 130 in display panel 100 terminate to form gap 140, other implementations are also possible. For example, in some embodiments, the width of the power lines can be significantly narrowed in the gap, rather than terminated entirely. An example of such an arrangement is shown in FIGS. 2A and 2B, where a display panel 200 includes power lines 230 that narrow in a portion 240 above sensor 150 and emitter 160. Here, a narrow portion 232 of the power line connects power line 230 across the top of bezel 120.

The narrow portion 232 of the power lines have a width 233 that is significantly less than the width 133 of power line 230 at the top edge of display panel 200 outside of portion 240. Generally, width 233 should be sufficiently small so that portion 232 of the power lines does not substantially interfere with the operation of sensor module 162. In some embodiments, width 233 can be in a range from 0.0001 mm to 0.1 mm.

While several embodiments are described, other arrangements are possible. For example, while the active area of display active area 110 and bezel 120 are generally rectangular, other geometries are possible. In some embodiments, for instance, the display active area can include a notch in which front-facing sensors are positioned. In such instances, the power line can follow the shape of the notch. Gaps in the power line or a narrowing of the power line can be located in the notch. Other display shapes (e.g., square, round, or other curved and/or polygonal shape) are possible.

Embodiments of the subject matter and the functional operations described in this specification can be implemented in any suitable electronic device such as a personal computer, a mobile telephone, a smart phone, a smart watch, a smart TV, a mobile audio or video player, a game console, or a combination of one or more of these devices that utilize a display panel and a front facing sensor.

The electronic device may include various components such as a memory, a processor, a display, and input/output units. The input/output units may include, for example, a transceiver which can communicate with the one or more networks to send and receive data. The display may be any suitable display including, for example, a cathode ray tube (CRT), liquid crystal display (LCD), or light emitting diode (LED) display, for displaying images.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

Embodiments may be implemented as one or more computer program products, e.g., one or more modules of computer program instructions encoded on a computer readable medium for execution by, or to control the operation of, data processing apparatus. The computer readable medium may be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

Processors suitable for the execution of a computer program include, by way of example, both general and special purpose microprocessors, and any one or more processors of any kind of digital computer. Generally, a processor will receive instructions and data from a read only memory or a random access memory or both.

Elements of a computer may include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer may not have such devices. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

Other embodiments are in the following claims.

What is claimed is:

1. A display panel, comprising:

a display active area comprising a plurality of pixels extending in a plane of the display panel;

a bezel surrounding the display active area;

a connector tab attached to the bezel at a first edge of the bezel; and one or more power lines formed from a material opaque at one or more wavelengths of electromagnetic radiation, the power lines extending from the connector tab to a second edge of the bezel opposite the first edge of the bezel, the power lines being located entirely outside the display active area and configured to supply electrical power to the display active area during operation of the display panel, the power lines having a first width in the plane of the display along a side edge of the bezel between the first and second edges and, at a portion of the bezel at the second edge, a second width narrower than the first width or a gap in the power lines, the portion of the bezel at the second edge being substantially transparent to the one or more wavelengths of electromagnetic radiation.

2. The display panel of claim 1, wherein the material is a metal.

3. The display panel of claim 1, wherein the first width is in a range from 0.1 mm to 3 mm.

4. The display panel of claim 1, wherein the second width is in a range from 0.0001 mm to 0.1 mm.

5. The display panel of claim 1, wherein the bezel has a width of 1 mm or less at the second edge.

6. The display panel of claim 1, wherein the portion has a width that is 50% or more of a width of the bezel at the second edge.

7. The display panel of claim 1, wherein the display panel is an organic light emitting diode (OLED) display panel.

8. A device, comprising:

the display panel of claim 1; and a sensor module positioned adjacent to the portion of the bezel at the second edge and arranged to direct and/or receive electromagnetic radiation at the one or more wavelengths transmitted through the bezel at the portion of the bezel.

9. The device of claim 8, wherein the device is a smart phone or a tablet computer.

10. The device of claim 8, wherein the sensor module comprises a sensor for detecting electromagnetic radiation at the one or more wavelengths.

11. The device of claim 8, wherein the sensor module comprises an emitter of electromagnetic radiation at the one or more wavelengths.

\* \* \* \* \*